(12) United States Patent  (10) Patent No.: US 7,164,236 B2
Mitrovic et al.  (45) Date of Patent: Jan. 16, 2007

(54) METHOD AND APPARATUS FOR IMPROVED PLASMA PROCESSING UNIFORMITY

(75) Inventors: Andrej S. Mitrovic, Phoenix, AZ (US); Eric J. Strang, Chandler, AZ (US); Murray D. Sirkis, Tempe, AZ (US); Bill H. Quon, Brea, CA (US); Richard Parsons, Phoenix, AZ (US); Yuji Tsukamoto, Wilmington, MA (US)

(73) Assignee: Tokyo Electron Limited, Tokyo (JP)

(*) Notice: Subject to any disclaimer, the term of this patent is extended or adjusted under 35 U.S.C. 154(b) by 250 days.

(21) Appl. No.: 10/793,253

(22) Filed: Mar. 5, 2004

(65) Prior Publication Data

US 2004/0168770 A1  Sep. 2, 2004

Related U.S. Application Data

(60) Division of application No. 10/359,557, filed on Feb. 7, 2003, which is a continuation of application No. PCT/US01/24491, filed on Aug. 6, 2001.

(60) Provisional application No. 60/223,834, filed on Aug. 8, 2000.

(51) Int. Cl.
*H05B 31/26* (2006.01)
*C23F 1/00* (2006.01)

(52) U.S. Cl. .............................. 315/111.01; 156/345.44

(58) Field of Classification Search ............ 118/723 E, 118/723 MP, 723 AN, 723 I, 682; 204/298.08, 204/298.34, 192.12; 315/111.01, 111.81, 315/111.91; 156/643.1, 345.37, 345.53, 156/345.28, 345.44

See application file for complete search history.

(56) References Cited

U.S. PATENT DOCUMENTS

| | | | |
|---|---|---|---|
| 4,500,408 A | 2/1985 | Boys et al. | ............ 208/298.03 |
| 4,827,219 A | 5/1989 | Harrison | |
| 5,057,185 A | 10/1991 | Thomas, III et al. | |
| 5,128,602 A | 7/1992 | Carter, Jr. | |
| 5,140,223 A | 8/1992 | Gesche et al. | |
| 5,366,553 A * | 11/1994 | Lair et al. | ................... 118/682 |
| 5,540,781 A | 7/1996 | Yamagami et al. | ...... 118/723 E |

(Continued)

FOREIGN PATENT DOCUMENTS

EP  0 961 307 A2  12/1999

(Continued)

*Primary Examiner*—Wilson Lee
(74) *Attorney, Agent, or Firm*—Pillsbury Winthrop Shaw Pittman LLP (57) ABSTRACT

A method and apparatus for generating and controlling a plasma (130) formed in a capacitively coupled plasma system (100) having a plasma electrode (140) and a bias electrode in the form of a workpiece support member (170), wherein the plasma electrode is unitary and has multiple regions ($R_i$) defined by a plurality of RF power feed lines (156) and the RF power delivered thereto. The electrode regions may also be defined as electrode segments (420) separated by insulators (426). A set of process parameters $A=\{n, \tau_i, \Phi_i, P_i, S; L_i\}$ is defined; wherein n is the number of RF feed lines connected to the electrode upper surface at locations $L_i$, $\tau_i$ is the on-time of the RF power for the $i^{th}$ RF feed line, $\Phi_i$ is the phase of the $i^{th}$ RF feed line relative to a select one of the other RF feed lines, $P_i$ is the RF power delivered to the electrode through the $i^{th}$ RF feed line at location $L_i$, and S is the sequencing of RF power to the electrode through the RF feed lines. One or more of these parameters are adjusted so that operation of the plasma system results in a workpiece (176) being processed with a desired amount or degree of process uniformity.

15 Claims, 6 Drawing Sheets

U.S. PATENT DOCUMENTS

| | | |
|---|---|---|
| 5,556,549 A | 9/1996 | Patrick et al. |
| 5,693,238 A | 12/1997 | Schmitt et al. ............... 216/67 |
| 5,733,511 A | 3/1998 | De Francesco |
| 5,770,922 A | 6/1998 | Gerrish et al. |
| 5,783,102 A | 7/1998 | Keller ......................... 216/68 |
| 5,889,252 A | 3/1999 | Williams et al. |
| 6,024,827 A | 2/2000 | Ishii ..................... 156/345.48 |
| 6,042,686 A | 3/2000 | Dible et al. ............ 156/345.44 |
| 6,050,217 A | 4/2000 | Li .......................... 118/723 E |
| 6,095,084 A * | 8/2000 | Shamouilian et al. .... 118/723 E |
| 6,101,971 A | 8/2000 | Denholm et al. ........ 118/723 E |
| 6,214,162 B1 * | 4/2001 | Koshimizu ............. 156/345.28 |
| 6,251,216 B1 | 6/2001 | Okamura et al. ........ 156/345.1 |
| 6,363,881 B1 | 4/2002 | Murata et al. ........... 118/723 E |
| 6,514,376 B1 * | 2/2003 | Collins et al. ......... 156/345.37 |
| 6,632,322 B1 | 10/2003 | Gottscho et al. ....... 156/345.33 |
| 6,905,578 B1 * | 6/2005 | Moslehi et al. ........ 204/192.12 |

FOREIGN PATENT DOCUMENTS

| | | |
|---|---|---|
| JP | 08-236294 KI | 9/1996 |

* cited by examiner

METHOD AND APPARATUS FOR IMPROVED PLASMA PROCESSING UNIFORMITY

This is a divisional application of U.S. application Ser. No. 10/359,557, filed on Feb. 7, 2003, which is a continuation of International Application No. PCT/US01/24491, filed on Aug. 6, 2001, which, in turn, claims benefit of U.S. application No. 60/223,834, filed Aug. 8, 2000, the contents of all of which are incorporated herein in their entirety by reference.

BACKGROUND OF THE INVENTION

The present invention pertains to plasma processing of workpieces, and in particular pertains to a method and apparatus for improving the uniformity of plasma processing.

Ionized gas or "plasma" may be used during processing and fabrication of semiconductor devices, flat panel displays and other products requiring etching or deposition of materials. Plasma may be used to etch or remove material from semiconductor integrated circuit wafers, or to sputter or deposit material onto a semiconducting, conducting or insulating surface. Creating a plasma for use in manufacturing or fabrication processes typically is done by introducing a low-pressure process gas into a chamber surrounding a workpiece such as an integrated circuit (IC) wafer. The atoms or molecules of the low-pressure gas in the chamber are ionized to form plasma by a radio frequency energy (power) source after the gas molecules enter the chamber. The plasma then flows over and interacts with the workpiece. The chamber is used to maintain the low pressures required for plasma formation, to provide a clean environment for processing the semiconductor devices and to serve as a structure for supporting one or more radio frequency energy sources.

Plasma may be created from a low-pressure process gas by inducing an electron flow that ionizes individual gas atoms or molecules by transfer of kinetic energy through individual electron-gas molecule collisions. Typically, electrons are accelerated in an electric field such as one produced by radio frequency (RF) energy. This RF energy may be low frequency (below 550 KHz), high frequency (e.g., 13.56 MHz), or microwave frequency (e.g., 2.45 GHz).

The two main types of etching in semiconductor processing are plasma etching and reactive ion etching (RIE). A plasma etching system typically includes a radio frequency energy source and a pair of electrodes. A plasma is generated between the electrodes, and the workpiece (i.e., substrate or wafer) to be processed is arranged parallel to one of the electrodes. The chemical species in the plasma are determined by the source gas(es) used and the desired process to be carried out.

A problem that has plagued prior art plasma reactor systems is the control of the plasma to obtain uniform etching and deposition. In plasma reactors, the degree of etch or deposition uniformity is determined by the design of the overall system, and in particular by the design of the RF feed transmission and the associated control circuitry.

In a plasma reactor system, the electrode is connected to a RF power supply. The technological trend in plasma reactor design is to increase the fundamental RF driving frequency of the RF power supply from the traditional value of 13.56 MHz to 60 MHz or higher. Doing so improves process performance, but increases the complexity of reactor design.

Figure 1:
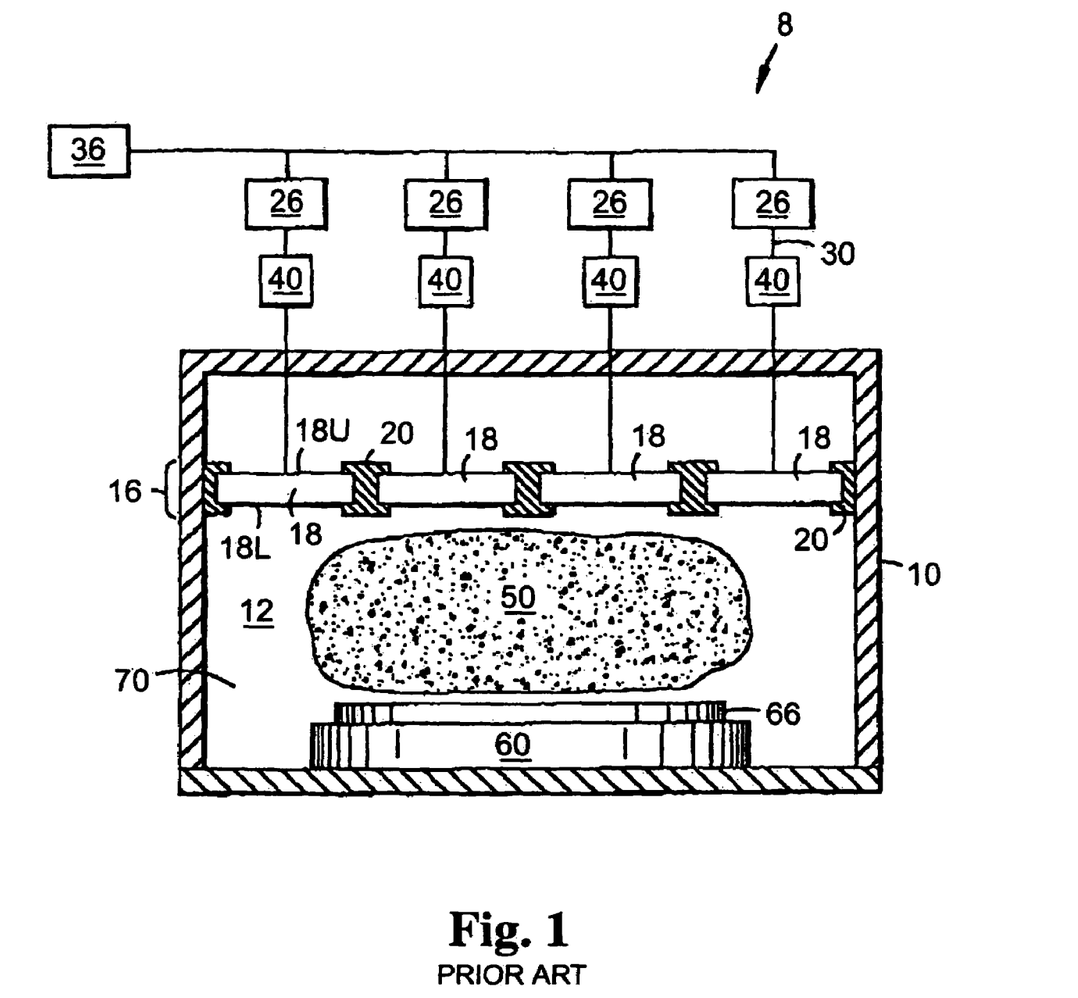
FIG. 1 is a schematic cross-sectional diagram of a prior art plasma reactor system having a segmented electrode comprising a plurality of electrode segments with corresponding RF power supplies connected thereto.

One approach to improving etch and deposition uniformity has been to use a multi-segment electrode. With reference to FIG. 1, plasma reactor system 8 comprises reactor chamber 10 having an interior 12, within which is arranged a segmented electrode 16 having separate thick conducting electrode segments 18 each with an upper surface 18U and a lower surface 18L. A silicon slab or "facing" (not shown) may be attached to each of the lower surfaces 18L of the segmented electrode by suitable attachment means to control contamination due to sputtering of the metal electrode. Electrode segments 18 are separated by an insulator 20 and are powered by corresponding RF power supplies 26 via RF feed lines 30 connected to respective electrode segments. Power control to electrode segments 18 is provided by a main control unit 36. Match networks 40 arranged between RF power supplies 26 and electrode segments 18 are tuned to provide the best match to the load associated with a plasma 50 formed in interior region 12, so as to optimize power transfer to the plasma.

Reactor system 8 includes a workpiece support member 60 opposite segmented electrode 16, upon which a workpiece 66, such as a wafer, is supported. The design of segmented electrode 16 is such that lower surfaces 18L of electrode segments 18 interfaces with a vacuum region 70 in interior region 12. This puts electrode segments 18 directly in contact with plasma 50 formed in vacuum region 70, although if silicon facings as mentioned above (not shown) are used, the surfaces of the silicon electrode facings will be directly in contact with plasma 50. Numerous seals (not shown) are required between insulators 20 and the electrode segments, and between the chamber 10 and insulators 20, to isolate vacuum region 70.

Current plasma reactor systems can perform an etch process with approximately 5% non-uniformity. This level of performance is sufficient to meet near-term needs for state-of-the-art process performance, but will soon be inadequate as the demands on the manufacturing process increase to require, on a routine basis, non-uniformity below 5%.

In light of the demands on improving process speed, one technological trend in plasma reactor design is to increase the fundamental RF frequency from the traditional value of 13.454 MHz to 60 MHz or higher, as mentioned above. Doing so improves process performance, but increases the complexity of reactor design. A second trend in reactor design is to have multiple electrodes, i.e., electrode segments, such as those discussed above in connection with FIG. 1. However, multiple electrodes combined with increased operating frequencies mean that delivering the correct amount of RF power becomes more complicated because of capacitive coupling between the electrode segments and greater sensitivity to parasitic capacitive and inductive elements. This effect is exacerbated by the shorter wavelengths of higher fundamental frequencies. The result is increased difficulty in reducing process non-uniformity.

In addition, current multi-segmented electrode plasma reactors require a power supply for each electrode. Thus, if there are five electrode segments, there must be five corresponding power supplies (or separate amplifiers). This leads to high cost and increased maintenance requirements and thus high wafer processing costs. This cost and increased maintenance might be worthwhile if there were a way to improve the performance of such a system to provide a higher degree of etch or deposition uniformity beyond the present limits of existing plasma processing systems.

BRIEF SUMMARY OF THE INVENTION

The present invention pertains to plasma processing of workpieces, and in particular pertains to a method and apparatus for improving the uniformity of the plasma processing.

The present invention is a method of and apparatus for generating and controlling a plasma formed in a capacitively coupled plasma system having a plasma electrode and a bias electrode, wherein the plasma electrode has multiple regions defined by RF power feed lines, with the size of each region being dependent on the amount of RF power delivered thereto. The electrode regions can also be defined as electrode segments separated by insulators. The RF power to each electrode region is independently controlled. In particular, the amplitude, phase, frequency, and/or "on-time" during which the RF power is applied to each RF feed line of the electrode can be varied, thereby affecting the spatial distribution of the plasma-exciting electric field and the plasma density (i.e., ion density) of the plasma.

Accordingly, a first aspect of the invention is an electrode apparatus for use in plasma processing. The apparatus comprises a unitary electrode having an upper surface and a lower surface. A unitary electrode is an electrode, usually planar, for which the entire electrode comprises either a single conductor or a plurality of conductors that are interconnected by means of low resistance ohmic contacts. A silicon facing; i.e., a so-called silicon electrode, can be attached by various attachment means to the lower surface of the unitary electrode in accordance with common practice. An RF multiplexer is electrically connected to a plurality of locations on the electrode upper surface via a corresponding plurality of RF feed lines. The unitary electrode has a plurality of electrode regions corresponding to the plurality of RF feed lines. These electrode regions are akin to electrode segments of a segmented electrode, differing therefrom in that the electrode regions of a unitary electrode are not separated by insulators. The apparatus can preferably include a plurality of match networks arranged one in each RF feed line in said plurality of RF feed lines. The apparatus can also preferably include a control system electrically connected to the RF multiplexer, for controlling the operation of said RF multiplexer when performing RF multiplexing.

A second aspect of the present invention is a plasma reactor system for processing a workpiece in a manner that achieves a high degree of process uniformity. The system comprises a plasma chamber having sidewalls, an upper surface and a lower surface defining an interior region capable of supporting plasma. A unitary electrode having an upper surface is arranged within the interior region adjacent the upper wall. A RF multiplexer is electrically connected to a plurality of locations on the upper surface of the unitary electrode via a corresponding plurality of RF feed lines. The electrode includes a plurality of electrode regions corresponding to the plurality of RF feed lines. Also included in the interior region adjacent the lower wall is a workpiece support member for supporting the workpiece.

A third aspect of the present invention is a method of determining a set of optimum plasma process parameters $A^* = \{n^*, \tau_i^*, \Phi_i^*, P_i^*, S^*; L_i\}$ for plasma processing a workpiece with a high degree of uniformity. The method is carried out in a plasma reactor chamber having an electrode with an upper surface as part of a plasma reactor system. The parameters are defined as follows: n is the number of RF feed lines connected to the electrode upper surface at locations $L_i$, $\tau_i$ s is the on-time of the RF power for the $i^{th}$ RF feed line, $\Phi_i$ is the phase of the $i^{th}$ RF feed line relative to a selected one of the other RF feed lines, $P_i$ is the RF power delivered to the electrode at location $L_i$ through the $i^{th}$ RF feed line, and S is the sequencing of RF power to the electrode through the RF feed lines. The method comprises a first step of setting initial values for process parameters n, $\tau_i$, $\Phi_i$, $P_i$, and S, and then a second step of processing one or more workpieces while varying one or more of said process parameters to determine the optimized set of process parameters $A^* = \{n^*, \tau_i^*, \Phi_i^*, P_i^*, S^*\}$ that achieve a process non-uniformity less than the predetermined standard. The second step includes the steps of forming a first plasma within the reactor chamber having characteristics corresponding to the initial process parameters and processing a first workpiece for a predetermined process time, measuring the workpiece process uniformity, and comparing the workpiece process uniformity to a predetermined standard. If the workpiece process non-uniformity is greater than the predetermined standard, then at least one of the process parameters is changed and the above-steps repeated (using either the first workpiece or a different workpiece) until the workpiece process non-uniformity is less than the predetermined standard.

A fourth aspect of the invention involves processing a workpiece using the optimized process parameters deduced as described above in connection with the third aspect of the invention.

A fifth aspect of the invention is the method of the first aspect of the invention, but carried out to achieve a desired degree of process uniformity. Such a method might be performed where there is a need to purposely provide a certain amount of process non-uniformity to counter other process effects.

DETAILED DESCRIPTION OF THE INVENTION

The present invention pertains to plasma processing of workpieces, and in particular pertains to a method and apparatus for improving the uniformity of the plasma processing.

Figure 2A:
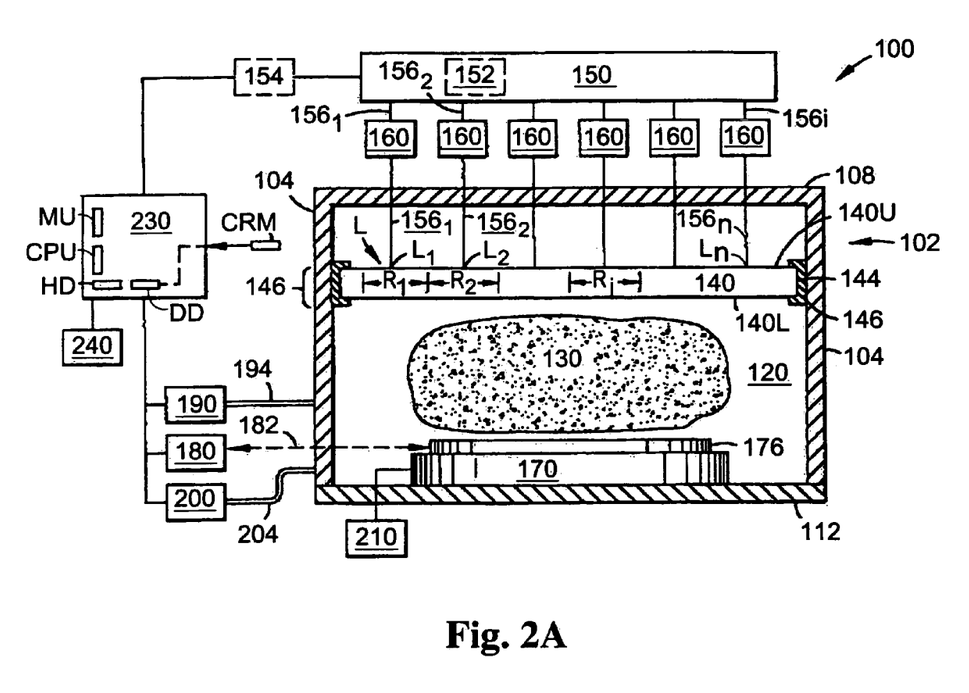
FIG. 2A is a schematic cross-sectional diagram of the plasma reactor system of the present invention having a unitary electrode with multiple RF feed lines connected at one end to various locations on the unitary electrode upper surface, and connected at the opposite ends to a RF power multiplexer.

With reference to FIG. 2A, plasma reactor system 100 comprises reactor chamber 102 with sidewalls 104, an upper wall 108 and a lower wall 112 defining an interior region 120 capable of supporting plasma 130. Arranged within interior region 120 near upper wall 108 is a unitary electrode 140 having an upper surface 140U and a lower surface 140L and a periphery 144. Electrode 140 is referred to as the "plasma electrode". Insulators 146 are arranged between electrode periphery 144 and sidewalls 104 to electrically isolate electrode 140 from chamber 102. System 100 further includes a RF power multiplexer 150. A RF power supply 152 is included in RF multiplexer 150. Alternatively, an external RF power supply (as illustrated by RF power supply 154) is provided.

Figure 2B:
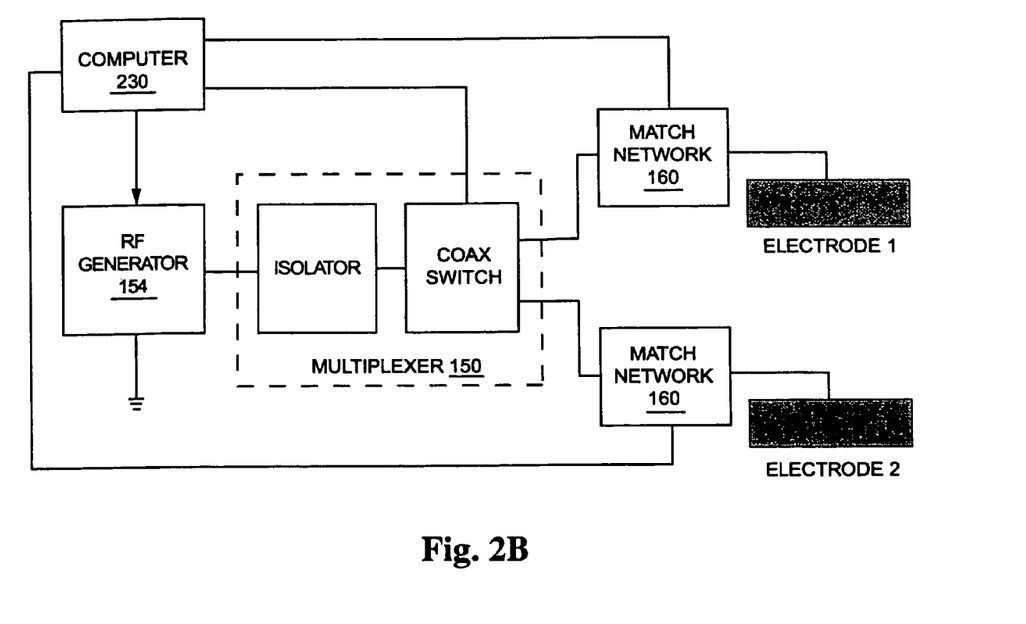
FIG. 2B is a block diagram of an embodiment of one component of the system of FIG. 2A.

FIG. 2B shows an exemplary layout of a multiplexer 150 acting to distribute RF power from a single RF generator 154 sequentially to a plurality of electrodes or electrode regions. Although only two electrodes are illustrated for the sake of simplicity, it will be understood that any number of electrodes can be supplied. In FIG. 2B a central computer, or controller, 230 communicates with RF power generator 154, multiplexer 150 and one or more match networks 160. Multiplexer 150 is composed of an isolator and a coax switch. The isolator can be a commercially available product of the type distributed by HD Communications Corporation (1 Comac Loop, Ronkonkoma, N.Y. 11779) who specializes in RF, microwave, fiber optic and wireless communications products. In particular, that company distributes and custom builds UHF, VHF, high power circulators and isolators. For instance, devices in the frequency ranges of (VHF) 66–88, 144–225 MHz and (FM) 88–108 MHz are currently available. The coax switch can be a commercially available product distributed by Texas Towers, in particular the Ameritron RCS-8V. The specifications for the Ameritron RCS-8V are as follows: a frequency range of 0.5 to 450 MHz, power handling of 5000 W at 30 MHz, power handling of 1000 W at 150 MHz, <0.05 dB insertion loss and 50Ω impedance. Generator 154, match networks 160 and the coax switch of multiplexer 150 are all connected to be controlled by computer 230 to distribute power to the various electrodes in any desired pattern.

Reverting to FIG. 2A, system 100 further includes multiple (n) RF feed lines 156 (e.g., $156_i$, where i=1 to n) connected to multiplexer 150 and that pass through upper wall 108 and connect at their opposite ends to different locations $L_i$ (e.g., $L_1, L_2, \ldots L_n$) on electrode upper surface 140U. RF power multiplexer 150 is a device that directs RF power to one or more of the RF feed lines 156 at a given time. The locations $L_i$ of RF feed lines 156 define corresponding electrode regions $R_i$ (e.g., $R_1, R_2, \ldots R_n$) to which RF power is provided. The sizes of regions $R_i$ depend on the amount of RF power $P_i$ provided, relative to the amount of power provided to adjacent regions but typically each of these regions extends over an area of the order of the total electrode area divided by n. For a segmented electrode, when only a single electrode segment is powered, it is known that the highest process rate (etch or deposition rate) on a wafer occurs directly under that powered segment. Although a similar result occurs with a unitary electrode when a RF feed with its $L_i$ axially located is the only powered RF feed, when a RF feed with its $L_i$, located off-axis is the only powered RF feed, the highest process rate on a wafer occurs at a location diametrically opposite to that $L_i$.

System 100 also preferably includes match networks 160 arranged in RF feed lines 156 between RF multiplexer 150 and electrode 140. Match networks 160 are tuned to provide the best match to the load presented by plasma 130 formed within interior region 120 so as to optimize power transfer to the plasma.

Reactor system 100 further includes a workpiece support member 170 arranged adjacent lower wall 112 opposite segmented electrode 140, capable of supporting a workpiece 176, such as a wafer, to be processed (e.g., etched or coated) by means of plasma 130.

System 100 also includes a workpiece handling system 180 in operative communication with plasma chamber 102 (see dashed line 182), for placing workpieces 176 onto and removing workpieces 176 from workpiece support member 170. Also included is a gas supply system 190 in pneumatic communication with chamber 102 via a gas supply line 194 for supplying gas to chamber interior 120 to purge the chamber and to create plasma 130. The particular gases included in gas supply system 190 depend on the application. However, for plasma etching applications, gas supply system 190 preferably includes such gases as chlorine, hydrogen-bromide, octafluorocyclobutane, and various other fluorocarbon compounds, etc. For chemical vapor deposition applications, gas supply system 190 preferably includes silane, ammonia, tungsten-tetrachloride, titanium-tetrachloride, and the like.

Further included in system 100 is a vacuum system 200 in pneumatic communication with chamber 102 via a vacuum line 204. Also included in system 100 is a workpiece support power supply 210 electrically connected to workpiece support member 170, for electrically biasing the workpiece support member. This electrical connection allows workpiece support member 170 to serve as a lower electrode, also referred to as the "bias electrode".

System 100 also includes a main control system 230, which is in electronic communication with and controls and coordinates the operation of workpiece handling system 180, gas supply system 190, vacuum system 200, workpiece support power supply 210, and RF power multiplexer 150 through electrical signals. Main control system 230 thus controls the operation of system 100 and the plasma processing of workpieces 176 in the system, as described below.

In a preferred embodiment, main control system 230 is a computer with a memory unit MU having both random-access memory (RAM) and read-only memory (ROM), a central processing unit CPU with a microprocessor (e.g., a PENTIUM™ processor from Intel Corporation), and a hard disk HD, all electrically connected. Hard disk HD serves as a secondary computer-readable storage medium, and may be, for example, a hard disk drive for storing information corresponding to instructions for control system 230 to carry out the present invention, as described below. Control system 230 also preferably includes a disk drive DD, electrically connected to hard disk HD, memory unit MU and central processing unit CPU, wherein the disk drive is capable of accepting and reading (and even writing to) a computer-readable medium CRM, such as a floppy disk or compact disk (CD), on which is stored information corresponding to instructions for control system 230 to carry out the present invention. It is also preferable that control system 230 has data acquisition and control capability. A suitable control system 230 is a computer, such as a DELL PRECISION WORKSTATION 610™, available from Dell Corporation, Dallas, Tex.

System 100 also includes a database 240 electrically connected to (or alternatively, integral to) control system 230 for storing data pertaining to the plasma processing of workpiece 176, and for also including predetermined sets of instructions (e.g., computer software) for operating system 100 via control system 230 to process the workpieces.

Method of Operation

The operation of system 100 involves setting numerous process-related parameters that can be modified in optimizing RF power delivery to electrode 140 in a manner that allows the etch or deposition rate to be controlled to obtain a high degree of etch or deposition uniformity (i.e., non-uniformity less than 5%).

These process parameters are the number n of RF feed lines 156 providing power to electrode 140, the power on-time $\tau_i$ for the $i^{th}$ RF feed line (i=1 to n), the phasing $\Phi_i$ of the $i^{th}$ RF feed line or combinations of RF feed lines relative to a select one of the RF feed lines, the amount of power $P_i$ delivered to the $i^{th}$ RF feed line, and the sequence S of power $P_i$ delivered to the electrode via each RF feed line and hence to each electrode section $R_i$. An additional parameter, which is typically fixed but in certain cases can be varied, is the location $L_i$ ($L_1, L_2, \ldots L_n$) at which each of RF feed lines 156 is attached to upper surface 140U of electrode 140. These process parameters form a process parameter set A={n, $\tau_i$, $\Phi_i$, $P_i$, S; $L_i$}. Any of the parameters in set A can be combined and varied independently or in concert to achieve the desired workpiece uniformity requirements. These parameters can also be utilized to achieve differential workpiece processing when desired. In either case, the parameter set A that contains an optimized set of parameters is A*={n*, $\tau_i$*, $\Phi_i$*, $P_i$*, S*; $L_i$*}.

The optimum parameter set A* can be achieved empirically using the method comprising the following steps. With reference to the flow diagram 300 of FIG. 3, once a workpiece is loaded onto workpiece support member 170, the first step 301 is setting the parameters n, $\tau_i$, $\Phi_i$, $P_i$, S, and $L_i$ to initial values. As mentioned above, $L_i$ is typically fixed, but could be varied if the need arises, i.e., if varying the other process parameters does not result in an acceptable process uniformity. These initial values can be decided upon based on data from previously run experiments stored in database 240 or through the assistance of computer modeling. The second step 302 is forming plasma 130 within interior region 120 based on the initial parameter values set in step 301 and processing workpiece 176 with the plasma. Plasma 130 will have time-varying characteristics (e.g., plasma density, energy, etc.) corresponding to the initial values of the process parameters. The plasma characteristics (i.e. plasma density, energy, etc.) will vary in time in that, in particular, their spatial distributions will vary in time throughout the process run due to the RF power and/or other process parameter sequencing through the process run. For instance, a first electrode or electrode region is initially powered for a short time and corresponding to this condition there is a particular spatial distribution of the plasma properties. This short period of time is followed by a second short period of time during which a second electrode or electrode region is powered with a different corresponding distribution of plasma properties. Each of these short steps adds to form the entire process run.

Figure 3:
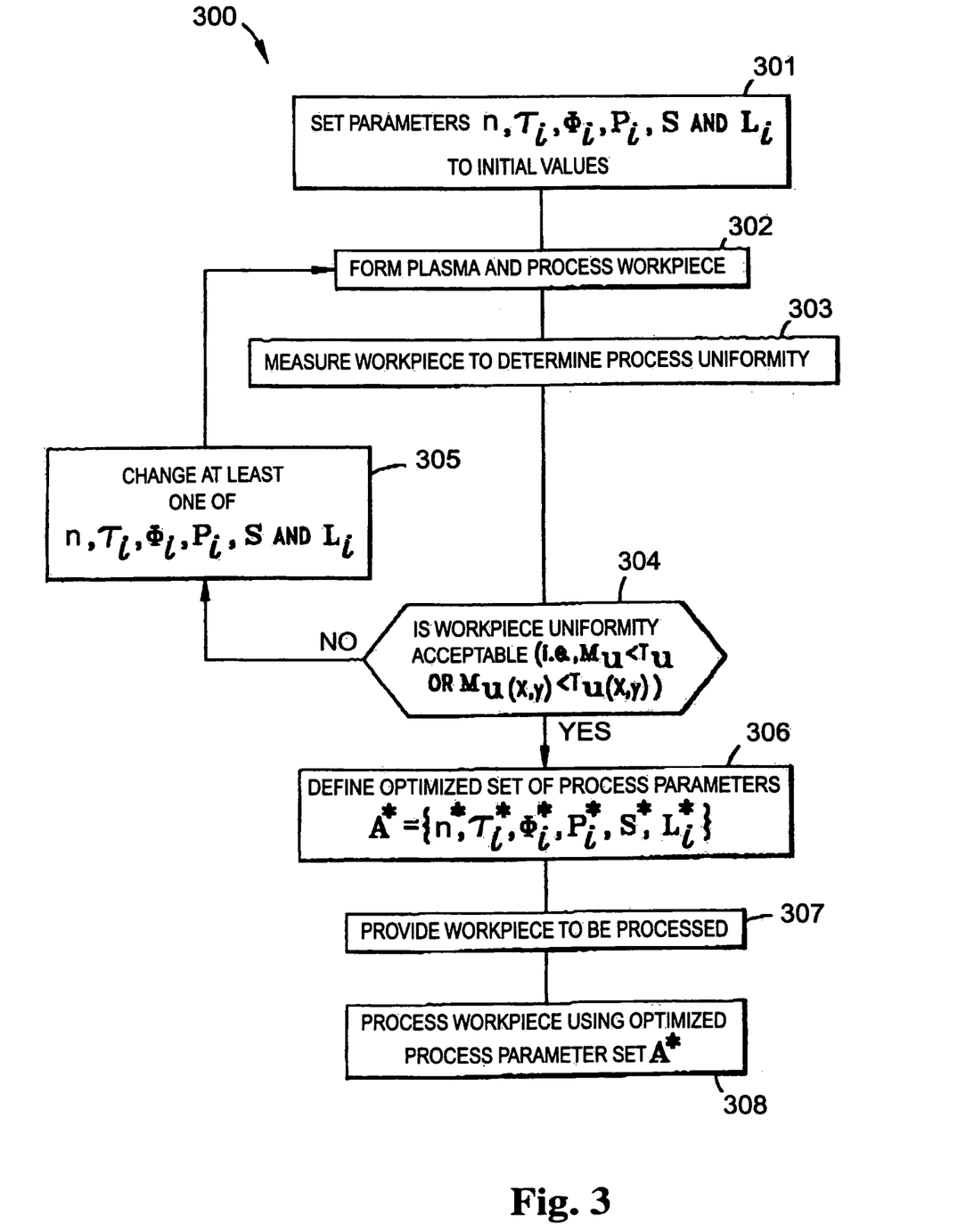
FIG. 3 is a flow diagram of the method according to the present invention of optimizing the process parameters of the plasma reactor system of FIG. 2.

In second step 302, workpiece 176 is processed with plasma 130 for a process time $T_P$. During this time, RF multiplexer 150, under the direction of controller 230, delivers an amount of RF power $P_i$ to each of the n RF feed lines 156$i$ for an "on-time" $\tau_i << T_P$. This process is referred to herein as "RF power multiplexing." Moreover, the sequencing S and phasing $\Phi_i$ of the n RF feed lines is also varied. The sequencing S can be such that only one location $L_i$ at a time is powered, or multiple locations $L_i$ at one time are powered.

Thus, the etch or deposition distribution for the entire process time $T_P$ can be considered as a linear superposition or a non-linear combination of the etch distributions achieved by applying RF power $P_i$ to each RF feed line 156 based on the initial set of process parameters A. Here, the various parameters, such as the on-time $\tau_i$ can be different or the same for each RF feed line 156$_i$. Further, the amount of RF power $P_i$ delivered can the same for all RF feed lines 156$_i$ as well.

With continuing reference to flow chart 300 of FIG. 3, the next step 303 is measuring the workpiece etch or deposition (i.e., process) uniformity. This is preferably accomplished using well-known optical interferometric techniques. The workpiece uniformity measurement is based on the greatest etch depth/deposition thickness minus the smallest etch depth/deposition thickness divided by two times the mean etch depth/deposition thickness of a large number of sites on the workpiece surface. For a wafer with a diameter of about 20 centimeters, a reasonable number of measurement sites is approximately 50 to 100. This results in a quantitative workpiece uniformity value $M_U$.

The next step 304 is assessing whether or not the workpiece uniformity measurement $M_U$ is acceptable, i.e., less than a certain predetermined standard (e.g., threshold) $T_U$. It can be the case that a certain degree of non-uniformity is sought to counter other processing effects, such as thin-film thickness variations across the surface of the workpiece. Such variations can be accounted for by measuring the spatial variation in uniformity as a function $M_U(x,y)$ and comparing it to a predetermined standard represented by a spatially dependent function $T(x,y)$ that corresponds to the non-uniformity profile sought. Here, it is assumed that the x-y plane lies in the plane of the workpiece surface being processed.

If the result in step 304 is that the workpiece uniformity is not acceptable (i.e., the non-uniformity is greater than a predetermined standard), then in the next step 305, based on the results of step 304, at least one of the initial process parameters n, $\tau_i$, $\Phi_i$, $P_i$, S and $L_i$ is changed in the effort to converge to the optimum set of process parameters, A*={n*, $\tau_i$*, $\Phi_i$*, $P_i$*, S*; $L_i$*}. Changing at least one of the process parameters results in plasma 130 that has time-varying characteristics different from the first-formed plasma 130. In this sense, plasma 130 represents first, second, third, etc. plasmas similar to but different from one another that may need to be formed in the process of deducing the optimum set of process parameters. As mentioned above, one or more of the process parameters in set A can be changed with the assistance of a computer program or algorithm that models the plasma etch or deposition process.

One approach to finding the optimum set of parameters A* is through the use of a linear superposition or a non-linear combination of etch or deposition rates based on each electrode region $R_i$. For a linear superposition, this can be stated as:

$$PR(x,y) = (1/T_P) \Sigma \, \tau_i \, W_i \, [PR_i(x,y)], \qquad \text{Eq. 1}$$

where $PR(x,y)$ is the overall process rate, $PR_i(x,y)$ is the process rate for each electrode region $R_i$, $T_P$ is the total process time (i.e., the sum of the $\tau_i$), and $W_i$ is a weighting coefficient. The summation is performed by summing from 1 to n. The weighting coefficient $W_i$ is a function of at least one of the above-defined process parameters. For a linear optimization, $W_i$ will typically be in the range of 0.9 to 1.1. Here, the weighting coefficients $W_i$ may be determined empirically based on the measurements made in step 303 by varying one or more of the parameter values to arrive at the required weighting coefficients $W_i$. Other more sophisticated computer models of the plasma etch process can also be used to assist in converging to the optimum process parameter set A*. Also, it will be apparent to one skilled in the art that non-linear equations can also be formed and solved in the manner similar to Eq. 1 to find the set of optimum parameters A*.

It should be noted here that though there can be a total of n RF feed lines 156 connected to upper surface 140U, fewer than all n RF feed lines may be activated. Here, it is assumed that n is the number of RF feed lines $156_i$ chosen to be activated. This number can be less than the total number of feed lines connected to upper surface 140U of electrode 140 because optimization of the process parameters can require that a certain group of the n RF feed lines not be activated.

Steps 302 to 305 are repeated until the measured workpiece uniformity $M_U$ is acceptable, thereby defining the optimum process parameter set A*. Once the iteration of steps 301–305 is completed, then in step 306 the optimum process parameter set A* is defined and recorded in database 240 and/or in control system 230 in memory unit MU. In the next step 307, a workpiece 176, such as a semiconductor wafer, is provided by placing the workpiece onto workpiece support member 170 via workpiece handling system 180. Then, in the next step 308, main control system 230 controls the formation of an "optimized" version of plasma 130 and controls the processing of workpiece 176 provided in step 307 according to the optimum set of process parameters A* established in step 306 and recorded in database 240 and/or control system 230. Step 308 is carried out for one or more workpieces 176. If workpiece 176 needs to be processed with a new plasma process step requiring plasma different from a particular form of plasma 130, then the steps of flow diagram 300 are repeated for the new plasma process.

By way of example, n can be five, but might also range between two and ten. A typical process time requires on the order of 60 seconds. If only one RF feed is excited at any given time, then if four sequences S occur with five RF feeds, each sequence S will last for 15 sec. If all of the $\tau_i$ are equal, each $\tau_i$ will be three seconds. If the $\tau_i$ are too short, the demands on the RF matching network(s) can be too great; i.e., steady-state conditions may not be attained during the time $\tau_1$.

With five RF feeds, one RF feed can be located on the axis of symmetry, with the other four located ninety degrees apart centered on a circle with a diameter approximately equal to ⅔ the wafer diameter. The parameter $\Phi_i$ is meaningful only if two or more RF feeds are powered simultaneously. The value for $P_i$ can be nearly equal, but need not be so. To provide high process throughput, it is preferable that the value for $P_i$ should be about the same as the power that would be delivered via a single feed to a conventional electrode.

Alternate Embodiments

The present invention, as described above, is a method and apparatus for delivering power at different locations to a unitary electrode. The process parameter optimization and operation method described above can also be applied to a number of alternate structural embodiments as shown in FIGS. 4A–D, below, including a multi-segment electrode having a plurality of electrode segments.

Figure 4A:
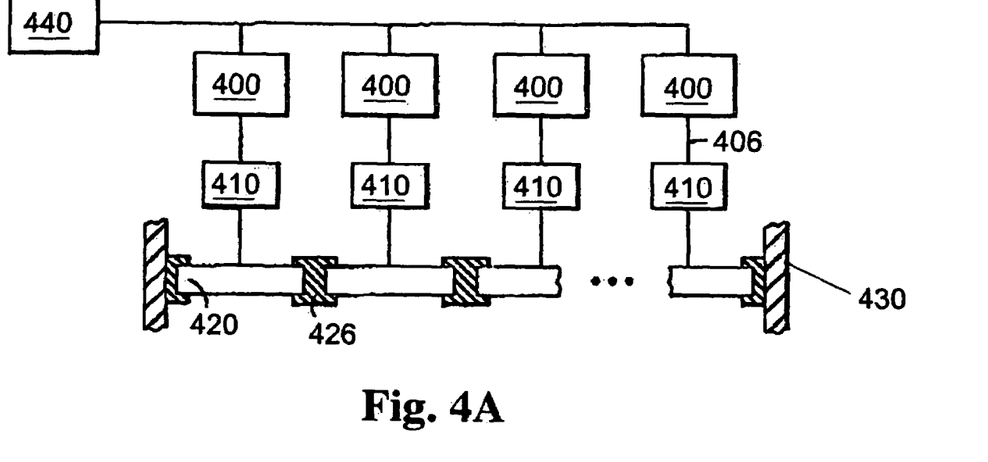
FIG. 4A is a schematic diagram of a first alternate embodiment for the RF power sources and electrode of the present invention, wherein multiple RF power supplies feed power through multiple match networks to electrode segments of a multi-segment electrode.

With reference to FIG. 4A, multiple RF power supplies 400 feed power through corresponding multiple RF feed lines 406 and multiple match networks 410 to corresponding electrode segments 420 in a multi-segment electrode. Electrode segments 420 are separated by insulators 426. In this first alternative embodiment, the number of power supplies, match networks, and electrode segments can be two or greater. A control system 440 similar if not identical to control system 230 is programmed to control the operation of RF power supplies 400 so that they are multiplexed in a manner that replicates the RF power multiplexing operation of RF multiplexer 150 of apparatus 100.

Figure 4B:
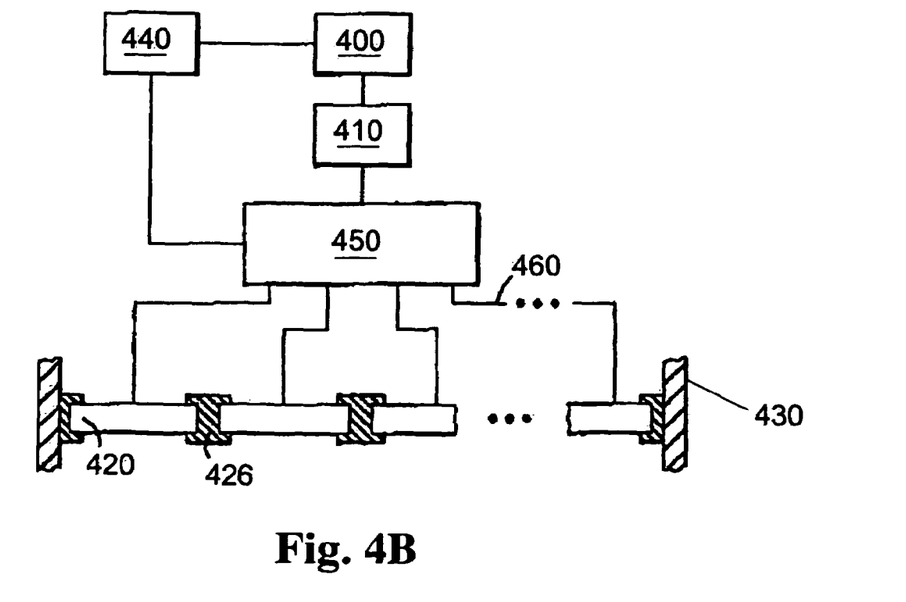
FIG. 4B is a schematic diagram of a second alternate embodiment for the RF power sources and electrode of the present invention, wherein a single RF power supply feeds power through a match network and a multiplexer distributing power to electrode segments in a multi-segment electrode.

With reference now to FIG. 4B, a single RF power supply 400 feeds power through a single match network 410 and a multiplexer 450 distributes power to electrode segments 420 of the multi-segment electrode via multiple RF feed lines 460. The number of electrode segments 420 can be two or greater. As described above earlier in connection with system 100, control system 440, similar if not identical to control system 230, controls the operation of multiplexer 450 during the operation of system 100. In the system shown in FIG. 4B, match network 410 may need to be to programmed to adjust itself each time multiplexer 450 switches.

Figure 4C:
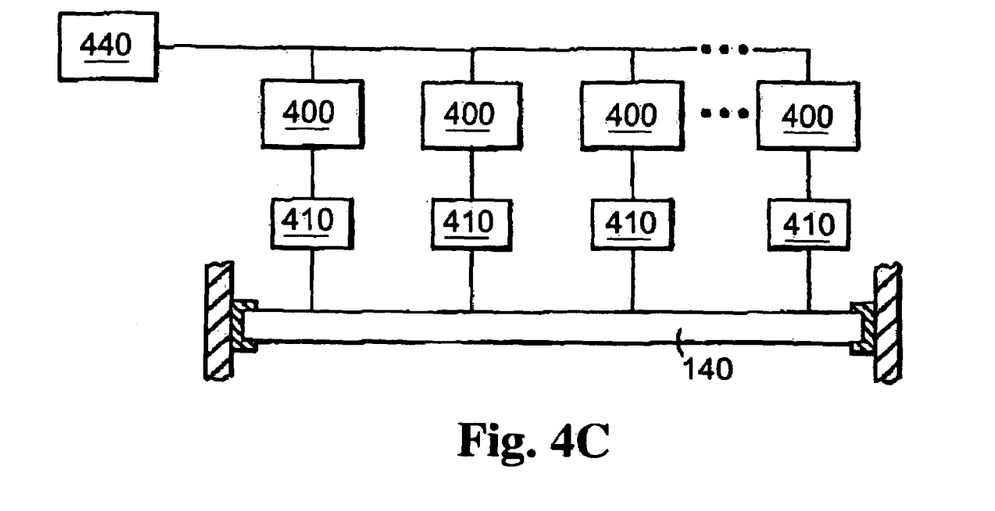
FIG. 4C is a schematic diagram of the first alternate embodiment for the RF power sources and electrode of the present invention, wherein multiple RF power supplies feed power through multiple match networks to a unitary electrode.

With reference now to FIG. 4C, multiple RF power supplies 400 feed power through multiple match networks 410 to a unitary electrode 140, and control system 440, similar if not identical to control system 230, is programmed to control the operation of RF power supplies 400 so that they are multiplexed in a manner that replicates the RF power multiplexing operation of RF multiplexer 150 of apparatus 100.

Figure 4D:
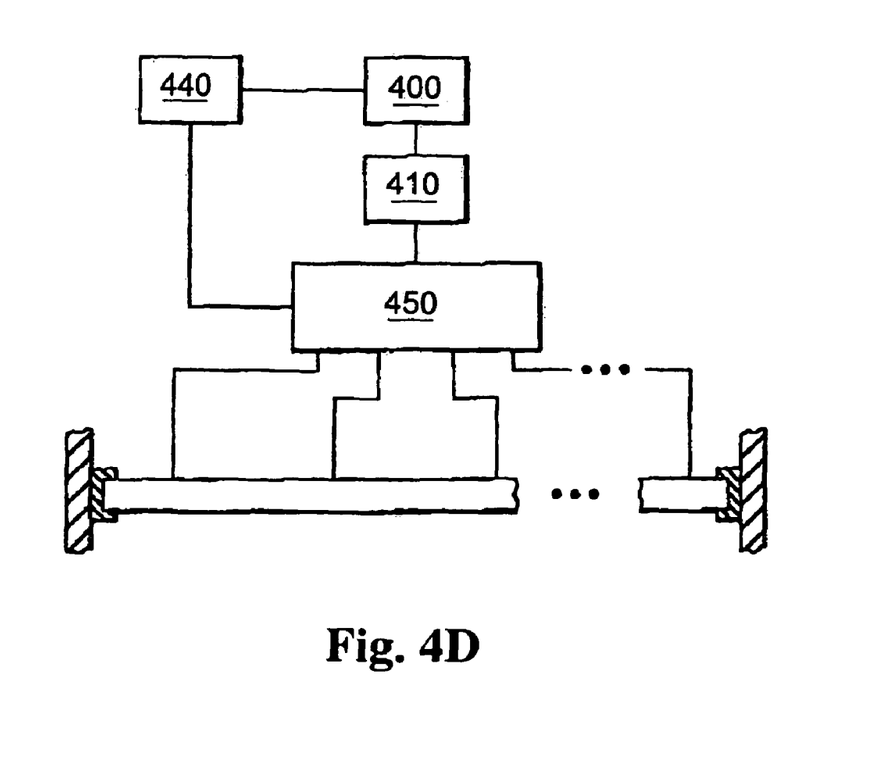
FIG. 4D is a schematic diagram of the second alternate embodiment for the RF power sources and electrode of the present invention, wherein a single RF power supply feeds power through a match network and a multiplexer distributing power to electrode regions $R_i$ of a unitary electrode.

With reference now to FIG. 4D, there is shown a system essentially the same as that described above in connection with system 100, except that a single adjustable match network 410 is used instead of a plurality of match networks. In the system of FIG. 4D, a single RF power supply 400 feeds power through match network 410 and a multiplexer 450 that distributes power to electrode regions $R_i$ of a unitary electrode.

In alternate embodiments, the embodiments of FIGS. 4A and 4B are extended to the use coil antennas wherein an electrode 420 can be a RF antenna.

The many features and advantages of the present invention are apparent from the detailed specification and thus it is intended by the appended claims to cover all such features and advantages of the described method that follow in the true spirit and scope of the invention. Further, since numerous modifications and changes will readily occur to those of ordinary skill in the art, it is not desired to limit the invention to the exact construction and operation illustrated and described. Moreover, the methods and apparatus of the present invention, like related apparatus and methods used in the semiconductor arts that are complex in nature, are often best practiced by empirically determining the appropriate values of the operating process parameters, or by conducting computer simulations to arrive at the optimum process parameters for a given application. Accordingly, all suitable modifications and equivalents should be considered as falling within the spirit and scope of the invention.

What is claimed is:

1. A method of determining a set of optimum plasma process parameters $A^*=\{n^*, \tau_i^*, \Phi_i^*, P_i^*, S^*; L_i^*\}$ for plasma processing, with a high degree of uniformity, a workpiece in a plasma reactor chamber having an electrode with an upper surface as part of a plasma reactor system, wherein n is the number of RF feed lines connected to the electrode upper surface at locations $L_i$, $\tau_i$ is the on-time of the RF power for the $i^{th}$ RF feed line, $\Phi_i$ is the phase of the $i^{th}$ RF feed line relative to a select one of the other RF feed lines, $P_i$ is the RF power delivered to the electrode to location $L_i$ through the $i^{th}$ RF feed line, and S is the sequencing of RF power to the electrode through the RF feed lines, the method comprising the steps of:
   a) setting initial values for process parameters n, $\tau_i$, $\Phi_i$, $P_i$, and S; and
   b) processing one or more workpieces while varying one or more of said process parameters to determine the optimized set of process parameters $A^*=\{n^*, \tau_i^*, \Phi_i^*, P_i^*, S^*\}$ that achieve a process non-uniformity less than a predetermined standard, including use of at least one of a linear or a non-linear processing model as a basis for varying at least one of the process parameters.

2. A method according to claim 1, wherein said step b) includes the steps of:
   i) forming a first plasma within the reactor chamber having characteristics corresponding to said process parameters and processing a first workpiece for a predetermined process time;
   ii) measuring the workpiece process uniformity; and
   iii) comparing the workpiece process uniformity to a predetermined standard.

3. A method according to claim 2, wherein said step b) further includes the step of:
   iv) reducing the workpiece process non-uniformity by changing at least one of said process parameters and repeating said steps i) through iii) using one of said first workpiece and a workpiece other than said first workpiece, until the workpiece process non-uniformity is less than said predetermined standard.

4. A method according to claim 1, wherein in said steps a) and b), the locations $L_i$ of the RF feed lines are parameters in the set A of process parameters that are varied.

5. A method according to claim 1, wherein the initial process parameter values are determined with the assistance of computer modeling.

6. A method according to claim 1, wherein said step b) includes use of a linear processing model as a basis for varying at least one of the process parameters.

7. A method according to claim 1, wherein said step b) includes use of a non-linear processing model as a basis for varying at least one of the process parameters.

8. A method according to claim 1, wherein said step b) includes providing RF power $P_i$ to a plurality of electrode segments in a multi-segment electrode by multiplexing RF power via RF power multiplexing.

9. A method according to claim 8, wherein said RF power multiplexing is accomplished by programming a control system electrically connected to a plurality of RF power supplies and electronically controlling the activation of the RF power supplies.

10. A method according to claim 1, wherein said step b) involves providing RF power $P_i$ to a unitary electrode via RF power multiplexing.

11. A method of processing a workpiece to be processed according to claim 1, further including the steps, after said step b), of:
    c) providing the workpiece to be processed in the reactor chamber;
    d) forming an optimized plasma with the process chamber using the set of optimized process parameters determined in said step b); and
    e) processing the workpiece to be processed with the optimized plasma.

12. A method of determining a set of optimum plasma process parameters $A^*=\{n^*, \tau_i^*, \Phi_i^*, P_i^*, S^*; L_i^*\}$ for plasma processing, with a desired degree of uniformity, a workpiece in a plasma reactor chamber having an electrode with an upper surface as part of a plasma reactor system, wherein n is the number of RF feed lines connected to the electrode upper surface at locations $L_i$, $\tau_i$ is the on-time of the RF power for the $i^{th}$ RF feed line, $\Phi_i$ is the phase of the $i^{th}$ RF feed line relative to a select one of the other RF feed lines, $P_i$ is the RF power delivered to the electrode to location $L_i$ through the $i^{th}$ RF feed line, and S is the sequencing of RF power to the electrode through the RF feed lines, the method comprising the steps of:
    a) setting initial values for process parameters n, $\tau_i$, $\Phi_i$, $P_i$, and S; and
    b) processing one or more workpieces while varying one or more of said process parameters to determine the optimized set of process parameters $A^*=\{n^*, \tau_i^*, \Phi_i^*, P_i^*, S^*\}$ that achieve a desired process uniformity, including use of at least one of a linear or a non-linear processing model as a basis for varying at least one of the process parameters.

13. A method according to claim 12, wherein said step b) includes the steps of:
    i) forming a first plasma within the reactor chamber having characteristics corresponding to said process parameters and processing a first workpiece for a predetermined process time;
    ii) measuring the workpiece process uniformity; and
    iii) comparing the workpiece process uniformity to a predetermined standard.

14. A method according to claim 12, wherein said step b) further includes the step of:
    iv) reducing the workpiece process non-uniformity by changing at least one of said process parameters and repeating said steps i) through iii) using one of said first workpiece and a workpiece other than said first workpiece, until the workpiece process non-uniformity is less than said predetermined standard.

15. A method of processing a workpiece to be processed according to claim 12, further including the steps, after said step b), of:
    c) providing the workpiece to be processed in the reactor chamber;
    d) forming an optimized plasma with the process chamber using the set of optimized process parameters determined in said step b); and
    e) processing the workpiece to be processed with the optimized plasma.

* * * * *